United States Patent [19]
Miyake et al.

[11] Patent Number: 5,503,950
[45] Date of Patent: Apr. 2, 1996

[54] REFLECTION TYPE MASK AND MANUFACTURE OF MICRODEVICES USING THE SAME

[75] Inventors: Akira Miyake; Yutaka Watanabe, both of Isehara, Japan

[73] Assignee: Canon Kabushiki Kaisha, Tokyo, Japan

[21] Appl. No.: 158,774

[22] Filed: Dec. 1, 1993

[30] Foreign Application Priority Data

Dec. 1, 1992 [JP] Japan .................................. 4-321908

[51] Int. Cl.⁶ ....................................................... G03F 9/00
[52] U.S. Cl. ................................ 430/5; 430/311; 430/322; 378/34; 378/35
[58] Field of Search ................................ 430/5, 311, 322; 378/34, 35

[56] References Cited

U.S. PATENT DOCUMENTS

| 5,012,500 | 4/1991 | Watanabe et al. ........................ 378/35 |
| 5,052,033 | 9/1991 | Ikeda et al. ............................... 378/35 |
| 5,190,836 | 3/1993 | Nakagawa et al. ........................ 430/5 |
| 5,328,784 | 7/1994 | Fukuda .................................... 430/321 |

FOREIGN PATENT DOCUMENTS

| 0252734 | 1/1988 | European Pat. Off. . |
| 0279670 | 8/1988 | European Pat. Off. . |
| 4118914 | 4/1992 | Japan . |

OTHER PUBLICATIONS

Kola, et al., "Stress Relaxation in Mo/Si Multilayer Structures," Appl. Phys. Lett., vol. 60, No. 25, Jun. 1992, pp. 3120 through 3122.

Ishii, et al., "Multilayer Mirror for Soft X-ray Synchrotron Radiation," NTT Review, vol. 2, No. 4, Jul. 1990, pp. 77 through 85.

Patent Abstracts of Japan, Kokai No. 02-177532, vol. 14, No. 448, Sep. 1990.

Sakaue, et al., "Mo-Si Multilayered Films for Soft X-Ray Mirrors," Thin Solid Films, vol. 201, No. 1, Jun. 1991, pp. 155 through 165.

Kinoshita, et al., "Soft X-Ray Reduction Lithography Using Multilayer Mirrors," J. Vac. Sci. Technol., vol. B7, No. 6, Nov./Dec. 1989, pp. 1648 through 1651.

Hsieh, et al., "All-Reflective Phase-Shifting Masks for Markle-Dyson Optics," J. Vac. Sci. Technol., vol. B10, No. 6, Nov./Dec. 1992, pp. 3042 through 3046.

Tennant, et al., "Defect Repair for Soft X-Ray Projection Lithography Masks," J. Vac. Sci. Technol., vol. B10, No. 6, Nov./Dec. 1992, pp. 3134 through 3140.

*Primary Examiner*—S. Rosasco
*Attorney, Agent, or Firm*—Fitzpatrick, Cella, Harper & Scinto

[57] ABSTRACT

A reflection type mask for X-ray lithography based on a phase shift method. A multilayered film of the mask is locally irradiated with an energy beam to provide a phase shifter, on the basis of a change in film thickness period resulting from a temperature rise. By heating the multilayered film to 100 deg. (°C.) or a few hundred deg. (°C.), a film thickness period change of a few percentages occurs without substantially changing the reflectivity. Thus, by selecting the heating condition suitably, a desired phase shifter for changing the phase of reflected light by $\pi$ can be provided.

18 Claims, 5 Drawing Sheets

REFLECTION TYPE MASK AND MANUFACTURE OF MICRODEVICES USING THE SAME

FIELD OF THE INVENTION AND RELATED ART

This invention relates generally to a reflection type mask usable, for example, in a lithographic apparatus wherein radiation energy such as X-rays or vacuum ultraviolet rays is used to project a pattern, with a reflection mirror, onto a resist.

In a lithographic process for optically transferring a fine pattern onto a resist for manufacture of semiconductor devices such as ICs, LSIs or liquid crystal panels, radiation energy such as X-rays or vacuum ultraviolet rays having higher resolution has been used to meet higher integration and further miniaturization of each semiconductor device. In exposure apparatuses of this type, radiation energy such as X-rays or vacuum ultraviolet rays from a light source source as a synchrotron or a laser plasma is projected to a reflection type mask having a pattern to be transferred. Reflected X-rays or vacuum ultraviolet rays from the mask are projected in a reduced scale onto a resist by using plural reflection mirrors. The reflection type mask used generally comprises a reflector on which an absorbing material film or an anti-reflection film is formed in accordance with the pattern to be transferred. The reflector may comprise a multilayered film having alternate layers of different materials.

A phase shift method is known as an expedient for enhancing the resolution of lithography. This phase shift method is applicable to a reflection type mask. On that occasion, the reflection type mask may comprise a phase shifter by which the phases of X-rays reflected by adjacent patterns of the mask have a mutual phase shift of $\pi$. When the X-rays or vacuum ultraviolet rays reflected by the mask are reduction-projected on a resist by means of reflection mirrors, between these patterns the intensity of the X-rays becomes equal to zero, whereby enhanced contrast is attained. In this method, the effect of reduction of contrast of the transferred pattern due to diffraction is suppressed without enlarging the numerical aperture of the imaging optical system, and this allows a larger depth of focus. As a result, the effect of a focus error due to wafer alignment error or warp of a wafer is small, and thus enhanced resolution of lithography is attainable.

SUMMARY OF THE INVENTION

A known phase shift reflection type mask is illustrated in FIG. 7, wherein a mask substrate 51 has surface steps 53 and a multilayered film 52 lying thereon. Denoted at 54 are elements of a pattern to be transferred. The manufacture of this type of mask involves difficulties in formation of the surface steps. Thus, it is not easy to increase the productivity or yield.

It is an object of the present invention to provide a reflection type mask, particularly, a reflection type X-ray mask for X-ray lithography based on a phase shift method, which can be manufactured with high productivity.

It is another object of the present invention to provide a method of manufacturing such a reflection type mask.

It is a further object of the present invention to provide an exposure apparatus using such a reflection type mask.

It is still a further object of the present invention to provide a method of manufacturing microdevices such as semiconductor devices by using a reflection type mask as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
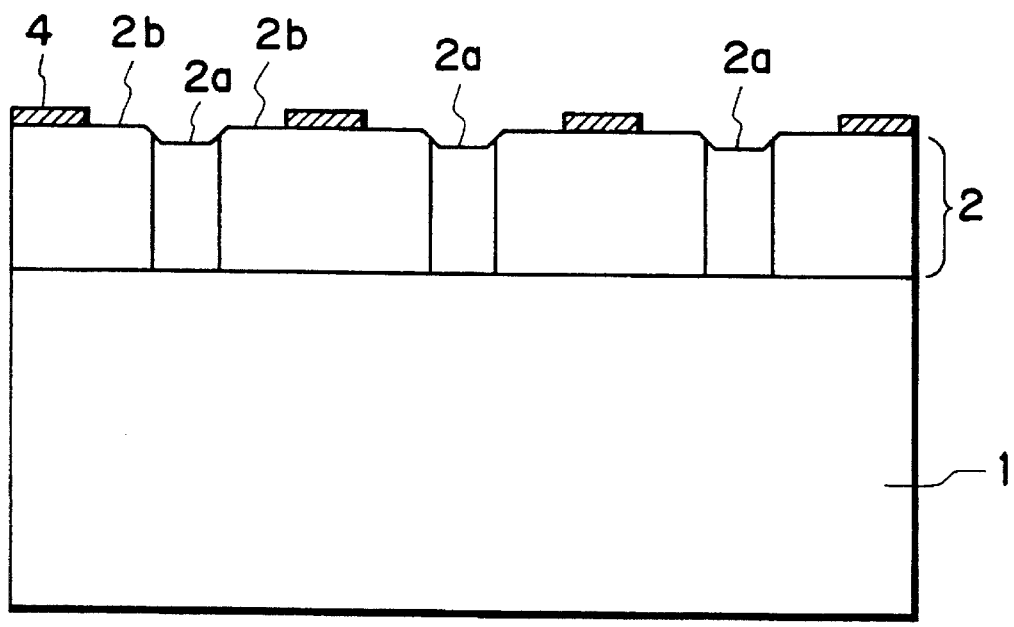
FIG. 1 is a schematic sectional view of a reflection type mask according to a first embodiment of the present invention.

Some preferred embodiments of the present invention will now be explained. Basically, in the present invention, a phase shifter is provided with the film thickness period of a multilayered film in a reflecting region being different with location, by which the phase of reflected X-rays is changed. The film thickness period of a mutilayered film may be changed by locally exposing the film to an energy beam such as an electron beam or ion beam.

If the film thickness period of a multilayered film is p, the quantity of change of the film thickness period is p', the wavelength of X-rays or vacuum ultraviolet rays used is $\lambda$, the angle of incidence is $\theta$ and the film thickness periodicity is m, then the surface step at the topmost face of the multilayered film is:

2mp'

It follows therefrom that the phase difference of reflected X-rays is given by:

$\delta = 4\pi mp' \cos\theta/\lambda$

If the refraction within the multilayered film is small, from the Bragg's condition, it follows that:

$p = n\lambda/2\cos\theta$ (where n is a natural number)

Thus, $\delta = 2\pi mnp'/p$

Therefore, for a change of $\pm\pi$ of the phase of light reflected by the topmost face of the multilayered film, the following is given:

2mnp'/p=1

(where n is an integer other than zero)

The phase change of reflected light as X-rays are projected on a multilayered film is not determined by the reflection at the top face only. It is determined also by the reflections at all the interfaces of lower layers. However, in a multilayered film having a sufficient number of accumulated layers to attain high reflectivity, the X-rays reflected at the top face contribute dominantly, such that only the phase change by the reflection at the topmost face may well be taken into account.

In the phase shift method, the phase shift quantity may not be exactly equal to $\pi$. An effect is obtainable if the quantity is within a range of $0.5-1.5\pi$. Thus, the quantity of change of the film thickness period may have a range corresponding to this. Finally, the film thickness period may be changed by p' which is given by the following relation:

$\frac{1}{2} < 2mnp'/p < \frac{3}{2}$ (n is an integer other than zero).

For locally changing the film thickness of a multilayered film of a reflection type mask, the multilayered film may be locally heated. This causes an increase or decrease, of a few percentages, of the film thickness period in accordance with the type of the materials constituting the film. The quantity of change of the film thickness period can be controlled by heating temperature or heating time. As a practical method for locally heating the multilayered film, irradiation with an energy beam such as an electron beam, an ion beam or a laser beam is preferable.

A reflection type mask has reflecting areas and non-reflecting areas, by which a mask pattern is defined. For formation of the non-reflecting areas, an energy beam may be projected to destroy the multilayered film structure. On that occasion, the non-reflecting areas and phase shifter elements can be produced only by modifying the condition of irradiation in a single energy beam projection process.

Embodiment 1

FIG. 1 shows a first embodiment, wherein a mask substrate 1 made of quartz has a multilayered film 2 comprising alternate layers of molybdenum and silicone. The multilayered film was formed by an RF magnetron sputtering method. Here, each molybdenum layer has a thickness of 3 nm, and each silicon layer has a thickness of 3.7 nm. The number of layers is twenty-five pairs. On such a film, an absorbing material pattern 4, comprising gold having a thickness of 100 nm, was formed through an ordinary photolithographic method in accordance with the mask pattern (circuit pattern).

After that, an electron beam was projected to a peripheral portion 2a of the absorbing material pattern 4 to locally heat the multilayered film to provide phase shifter means. As a result, the period of the multilayered film in the heated portion was decreased by about 2.5%, and the surface step at the surface of the multilayered film had a height of about 4.2 nm.

X-rays of a wavelength of 13 run were projected perpendicularly to the resultant mask. The portion 2a in which the film thickness period was changed and the portion 2b in which the film thickness period was not changed, both had a reflectivity of 60%. But, the phases of the reflected X-rays had a mutual difference of $0.95\pi$.

Figure 2:
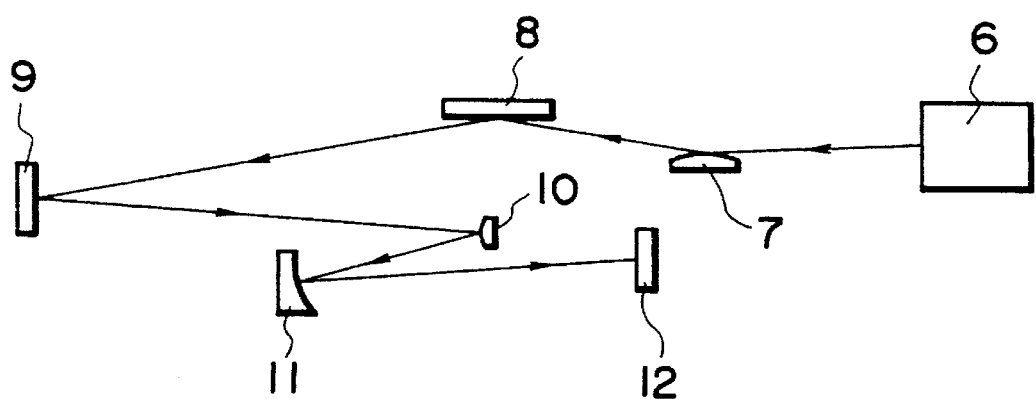
FIG. 2 is a schematic view of a reduction exposure apparatus using a reflection type mask such as shown in FIG. 1.

FIG. 2 shows an example of an exposure apparatus using such a reflection type mask. Beams from an undulator 6 which is a radiation source for producing soft X-rays of a wavelength of 13 nm, are expanded by means of two reflection mirrors 7 and 8, and they illuminate a reflection type mask 9 of the type described hereinbefore. The soft X-rays having intensities and phases changed by the reflection type mask 9, are reduced by an imaging optical system comprising two reflection mirrors 10 and 11, and they are projected on a resist which is applied to a wafer 12. By this, the mask pattern is lithographically transferred to the wafer. Here, the reduction ratio was 1/10, and the numerical aperture was 0.06. Thus, a Schwaltzschild optical system was defined. Reduction exposure experiments were made by using the exposure apparatus described, and a pattern of a linewidth of 90 nm was resolved.

Embodiment 2

Figure 3:
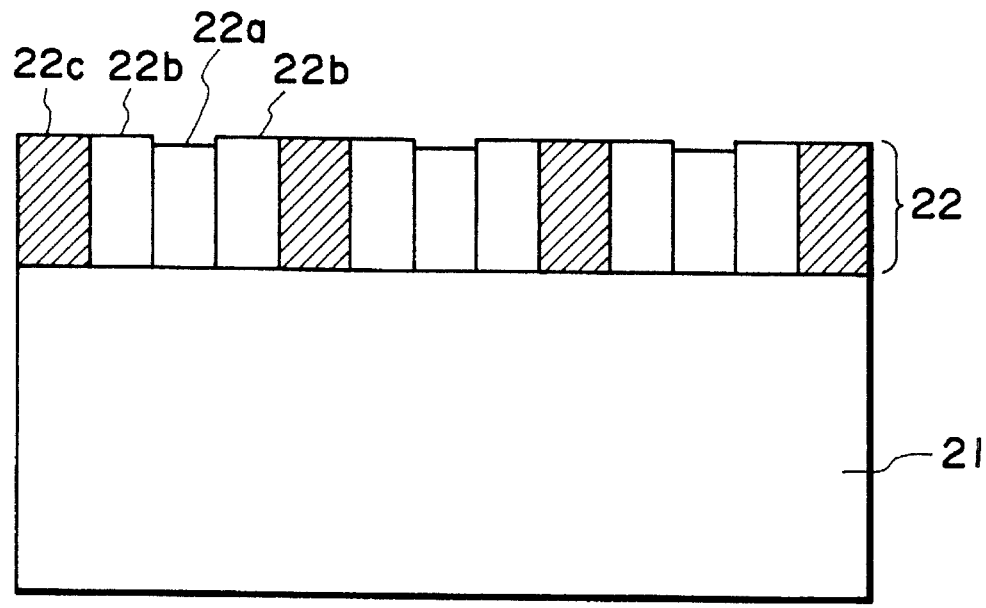
FIG. 3 is a schematic sectional view of a reflection type mask according to a second embodiment of the present invention.

FIG. 3 illustrates another embodiment, wherein a mask substrate made of silicon carbide has a multilayered film comprising alternate layers of tungsten and carbon. The multilayered film was formed by an ion beam sputtering method. Here, each tungsten layer has a thickness of 0.49 nm, and each carbon layer has a thickness of 1.91 nm. The number of layers is two hundred and fifty pairs.

An ion beam was then projected to a peripheral portion 22a of the multilayered film in accordance with a mask pattern (circuit pattern) to locally heat the multilayered film to destroy the multilayered film structure. In a portion 22b around the structure-destroyed portion, the multilayered film was heated and, as a result, the period was increased by about 0.2%, and the surface step at the surface of the multilayered film had a height of about 1.2 nm.

X-rays of a wavelength of 4.5 nm were projected to the resultant multilayered film with an angle of incidence of 20 deg., and the reflectivity was measured. The result is that the portion 22c not irradiated with the ion beam had a reflectivity of 35%, the destroyed portion 22a had an X-ray reflectivity of not greater than 0.1%, and the portion 22b in the neighborhood of it had a reflectivity of 32%. Also, the phases of the reflected X-rays from the portions 22b and 22c had a mutual difference of $0.9\pi$.

Figure 4:
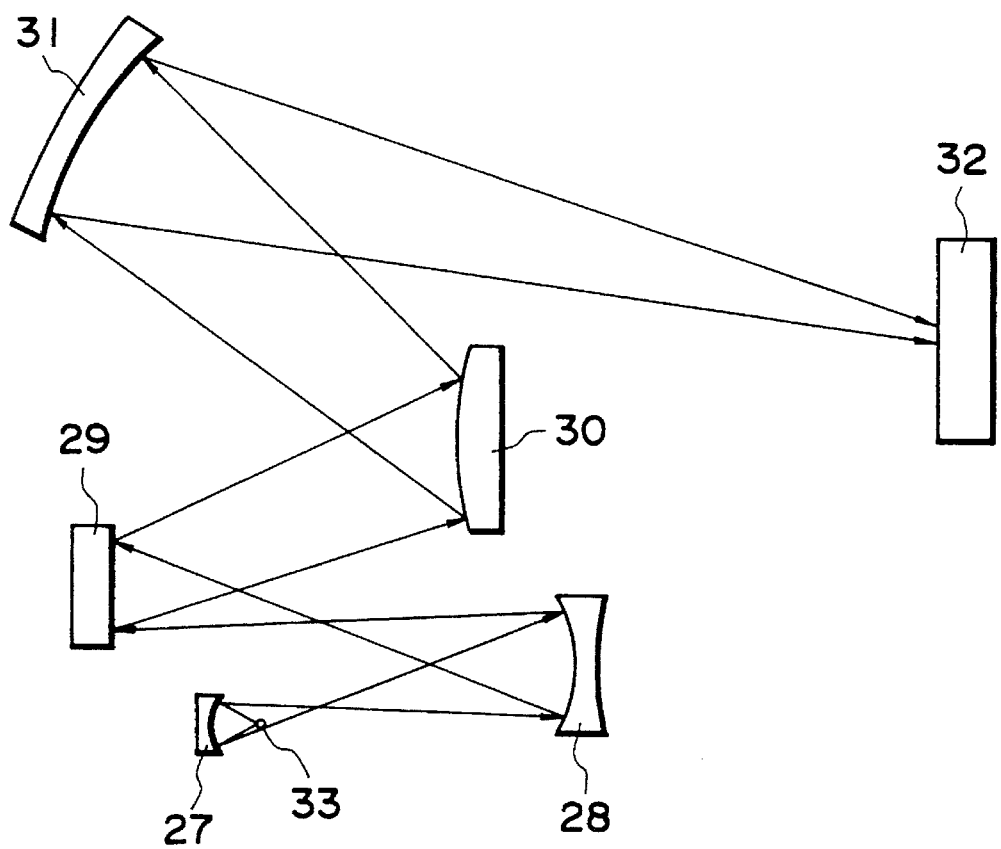
FIG. 4 is a schematic view of a reduction exposure apparatus using a reflection type mask such as shown in FIG. 3.

FIG. 4 shows an example of an exposure apparatus using such a reflection type mask. Beams from a laser plasma X-ray source 33 which is a radiation source for producing soft X-rays of a wavelength of 4.5 nm, are converged by means of two reflection mirrors 27 and 28, and they illuminate a reflection type mask 29 of the type described hereinbefore. The soft X-rays having intensities and phases changed by the reflection type mask 29, are reduced by an imaging optical system comprising two reflection mirrors 30 end 31, and they are projected on a resist which is applied to a wafer 32. By this, the mask pattern is lithographically transferred to the wafer. Here, the reduction ratio was 1/5, and the numerical aperture was 0.02. Thus, a Schwaltzschild optical system was defined. Reduction exposure experiments were made by using the exposure apparatus described, and a pattern of a linewidth of 120 nm was resolved.

In accordance with this embodiment, non-reflecting areas and phase shifter elements can be formed through a single process. Thus, it is very effective to improve the mask pattern position precision, the productivity end the yield.

Embodiment 3

Now, an embodiment of a semiconductor device manufacturing method according to the present invention, which uses an exposure apparatus such as described hereinbefore, will be explained.

Figure 5:
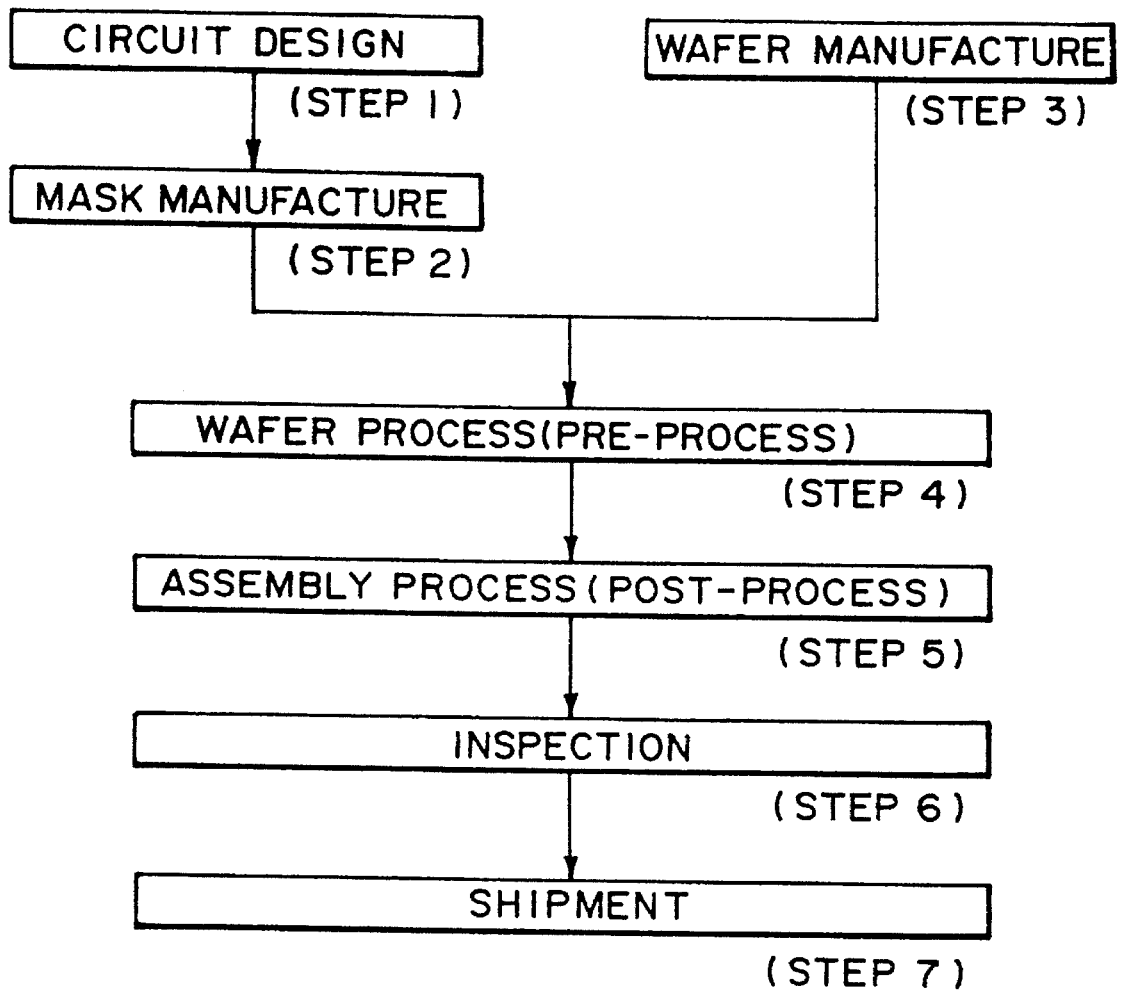
FIG. 5 is a flow chart of semiconductor device manufacturing processes.

FIG. 5 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing s mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (Step 7).

Figure 6:
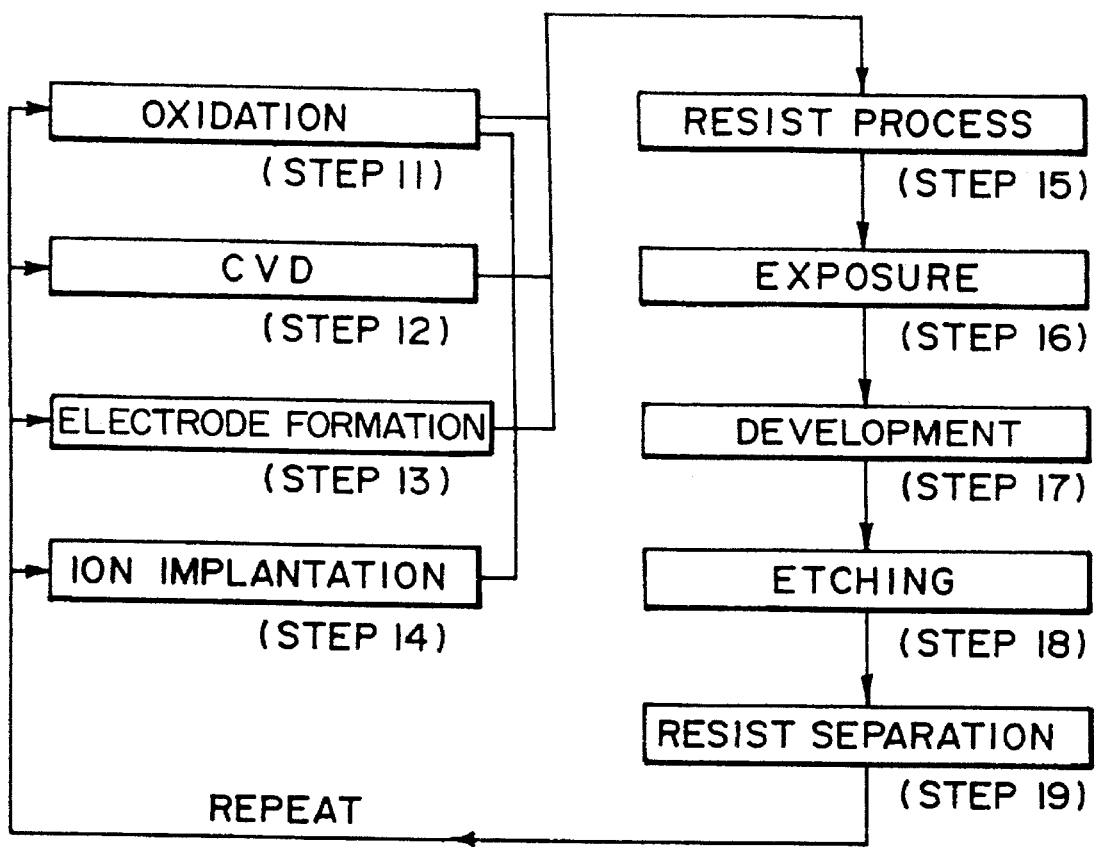
FIG. 6 is a flow chart, depicting details of a wafer process.
Figure 7:
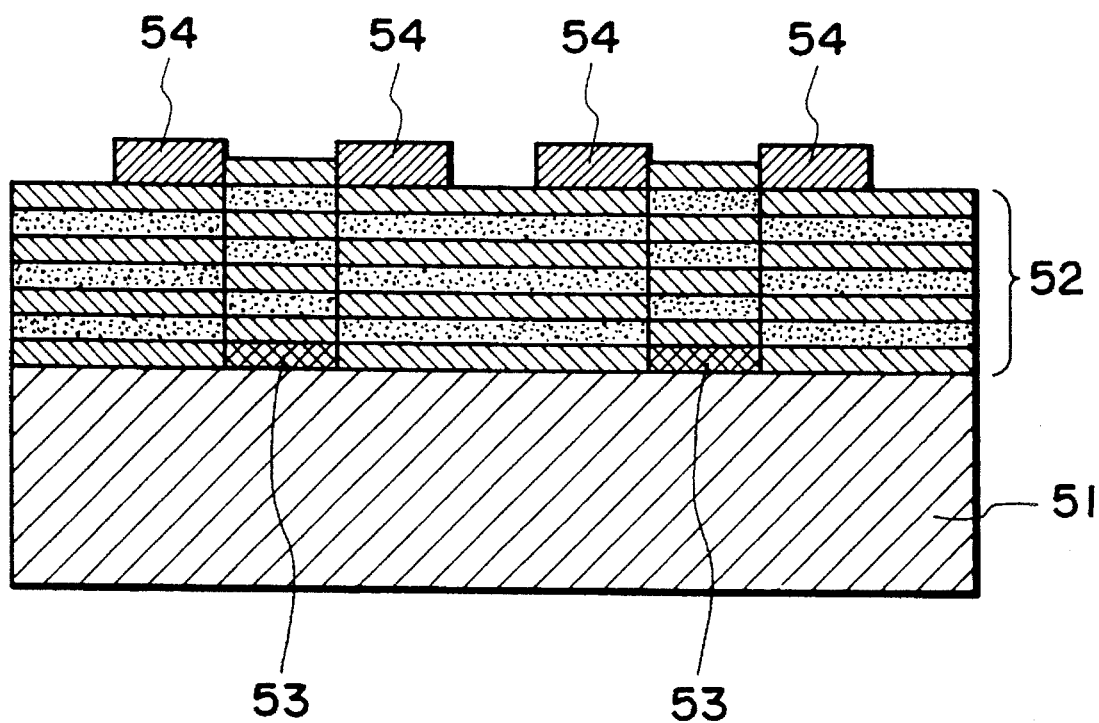
FIG. 7 is a schematic sectional view of a known reflection type mask.

FIG. 6 Is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A reflection type mask, comprising:

a base; and a reflecting region provided by a multilayered film formed on the base, for defining a mask pattern, wherein said multilayered film includes repetition of a set of layers of different materials with a film thickness period, and wherein the film thickness period changes with location in the reflection region.

2. A mask according to claim 1, wherein the following relation is satisfied:

$½<2mnp'/p<3/2$ where p is the film thickness period, p' is the difference in film thickness period, m is the film thickness periodicity and n is an integer other than zero.

3. A mask according to claim 1, wherein said mask is a phase-shift type mask.

4. A mask according to claim 1, wherein said mask is an X-ray mask for X-ray lithography.

5. A method of manufacturing a reflection type mask, comprising the steps of:

providing a reflection region by forming a multilayered film on a base, the multilayered film including repetition of a set of layers of different materials with a film thickness period; and locally irradiating the multilayered film with an energy beam to provide in the multilayered film a portion having a changed film thickness period such that the film thickness period changes with location in the reflection region.

6. A mask according to claim 5, wherein said energy beam comprises an electron beam.

7. A mask according to claim 5, wherein said energy beam comprises an ion beam.

8. A mask according to claim 5, wherein said energy beam comprises a laser beam.

9. A method of manufacturing a reflection type mask, comprising the steps of:

providing a reflection region by forming a multilayered film on a base, said multilayered film including repetition of a set of layers of different materials with a film thickness period; and locally irradiating the multilayered film with an energy beam to provide in the multilayered film a portion having a changed film thickness period such that the film thickness period changes with location in the reflection region and a portion having a decreased reflectivity.

10. A method according to claim 9, wherein the energy beam comprises an electron beam.

11. A method according to claim 9, wherein the energy beam comprises an ion beam.

12. A method according to claim 9, wherein the energy beam comprises a laser beam.

13. An exposure apparatus to be used with a reflection type mask, comprising:

means for holding a reflection type mask having a reflecting region provided by a multilayered film for defining a mask pattern, wherein said multilayered film includes repetition of a set of layers of different materials with a film thickness period, and wherein the film thickness period changes with location in the reflection region;

means for irradiating the reflection type mask with radiation energy; and means comprising a reflector, for reduction-projecting the radiation energy reflected by the reflection type mask onto a substrate so as to lithographically transfer the mask pattern onto the substrate.

14. An apparatus according to claim 13, wherein said mask is a phase-shift type mask.

15. An apparatus according to claim 13, wherein the radiation energy comprises X-rays.

16. A method of manufacturing microdevices by using a reflection type mask, said method comprising the steps of:

providing a reflection type mask having a reflecting region formed with a multilayered film for defining a mask pattern, wherein said multilayered film includes repetition of a set of layers of different materials with a film thickness period, and wherein the film thickness period changes with location in the reflection region;

irradiating the reflection type mask with radiation energy; and reduction-projecting the radiation energy reflected by the reflection type mask onto a substrate so as to lithographically transfer the mask pattern onto the substrate.

17. A method according to claim 16, wherein the mask is a phase-shift type mask.

18. A method according to claim 16, wherein the radiation energy comprises X-rays.

* * * * *

UNITED STATES PATENT AND TRADEMARK OFFICE
CERTIFICATE OF CORRECTION

PATENT NO. : 5,503,950
DATED : April 2, 1996
INVENTOR(S) : Akira MIYAKE, et al.

It is certified that error appears in the above-indentified patent and that said Letters Patent is hereby corrected as shown below:

COLUMN 1:

Line 20, "source" (second occurrence) should be deleted.

COLUMN 2:

Line 56, "number)" should read --number).--; and

Line 64, "zero)" should read --zero).--.

COLUMN 3:

Line 53, "13 run" should read --13 nm--.

COLUMN 4:

Line 45, "end" should read --and--.

UNITED STATES PATENT AND TRADEMARK OFFICE
CERTIFICATE OF CORRECTION

PATENT NO. : 5,503,950
DATED : April 2, 1996
INVENTOR(S) : Akira MIYAKE, et al.

It is certified that error appears in the above-indentified patent and that said Letters Patent is hereby corrected as shown below:

COLUMN 5:

Line 1, "s" should read --a--; and
Line 16, "Is" should read --is--.

Signed and Sealed this

Thirteenth Day of August, 1996

Attest:

BRUCE LEHMAN

*Attesting Officer*  *Commissioner of Patents and Trademarks*